United States Patent
Xu et al.

(10) Patent No.: US 10,254,898 B2
(45) Date of Patent: Apr. 9, 2019

(54) TOUCH DISPLAY PANEL AND DISPLAY DEVICE

(71) Applicants: BOE TECHNOLOGY GROUP CO., LTD., Beijing (CN); HEFEI XINSHENG OPTOELECTRONICS TECHNOLOGY CO., LTD., Hefei, Anhui (CN)

(72) Inventors: Jun Xu, Beijing (CN); Hu Li, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 366 days.

(21) Appl. No.: 14/770,676

(22) PCT Filed: Jan. 4, 2015

(86) PCT No.: PCT/CN2015/070049
§ 371 (c)(1),
(2) Date: Aug. 26, 2015

(87) PCT Pub. No.: WO2016/050007
PCT Pub. Date: Apr. 7, 2016

(65) Prior Publication Data
US 2016/0364037 A1  Dec. 15, 2016

(30) Foreign Application Priority Data
Sep. 29, 2014 (CN) .......................... 2014 1 0514944

(51) Int. Cl.
| G06F 3/042 | (2006.01) |
| G02F 1/1335 | (2006.01) |
| G06F 3/041 | (2006.01) |
| H01L 27/32 | (2006.01) |
| H01L 51/52 | (2006.01) |
| G02F 1/1333 | (2006.01) |

(52) U.S. Cl.
CPC ........ *G06F 3/042* (2013.01); *G02F 1/133512* (2013.01); *G02F 1/133514* (2013.01);
(Continued)

(58) Field of Classification Search
CPC ......... G09G 3/00; G06F 3/042; G06F 3/0412; H01L 27/3244; H01L 27/323;
(Continued)

(56) References Cited

U.S. PATENT DOCUMENTS 5,754,263 A * 5/1998 Akiyama .......... G02F 1/133512
349/110
2006/0046078 A1* 3/2006 Richter ............... C03C 17/3411
428/447
(Continued)

FOREIGN PATENT DOCUMENTS

CN  101153972 A  4/2008
CN  101452136 A  6/2009
(Continued)

OTHER PUBLICATIONS

International Search Report and Written Opinion dated Jun. 17, 2015: PCT/CN2015/070049.
(Continued)

*Primary Examiner* — Towfiq Elahi
(74) *Attorney, Agent, or Firm* — LADAS & PARRY LLP

(57) ABSTRACT

A touch display panel and a display device are provided. The touch display panel includes a first substrate and a second substrate disposed opposite to each other; a black matrix; and a plurality of light sensing elements, a plurality of scan lines and a plurality of signal lines formed on the second substrate; the black matrix is formed on the first substrate and only transmits light within the first wavelength range; the light sensing elements are shaded by the black matrix; each scan line is connected to a first end of the correspond-
(Continued)

ing light sensing element, and each signal line is connected to a second end of the corresponding light sensing element; and the light sensing element is configured to generate a touch signal according to the received light within the first wavelength range and the scanning signal provided by the scan line and supply the touch signal to the corresponding signal line. The touch display panel has a simple structure and a relatively low cost.

20 Claims, 3 Drawing Sheets

(52) U.S. Cl.
CPC .......... *G06F 3/0412* (2013.01); *H01L 27/322* (2013.01); *H01L 27/323* (2013.01); *H01L 27/3225* (2013.01); *H01L 27/3244* (2013.01); *H01L 51/5284* (2013.01); *G02F 1/13338* (2013.01)

(58) Field of Classification Search
CPC ................ H01L 27/322; H01L 27/3225; H01L 51/5284; G02F 1/1335; G02F 1/133514
See application file for complete search history.

(56) References Cited

U.S. PATENT DOCUMENTS

| | | | |
|---|---|---|---|
| 2007/0268206 A1* | 11/2007 | Kinoshita | G06F 3/0412 345/30 |
| 2008/0074401 A1 | 3/2008 | Chung et al. | |
| 2009/0146992 A1 | 6/2009 | Fukunaga et al. | |
| 2010/0164906 A1 | 7/2010 | Fukunaga et al. | |
| 2011/0310057 A1 | 12/2011 | Wang | |
| 2012/0139866 A1* | 6/2012 | Jung | G06F 3/0421 345/174 |
| 2013/0088460 A1* | 4/2013 | Ahn | G06F 3/0412 345/175 |
| 2013/0169569 A1* | 7/2013 | Shih | G06F 3/041 345/173 |
| 2014/0145976 A1 | 5/2014 | Tang et al. | |
| 2014/0247403 A1 | 9/2014 | Mun et al. | |
| 2015/0015543 A1* | 1/2015 | Hsieh | G06F 3/0421 345/175 |
| 2015/0234538 A1 | 8/2015 | Xu | |

FOREIGN PATENT DOCUMENTS

| | | |
|---|---|---|
| CN | 101762899 A | 6/2010 |
| CN | 103412673 A | 11/2013 |
| CN | 104299520 A | 1/2015 |
| JP | 07325319 A | 12/1995 |

OTHER PUBLICATIONS

First Chinese Office Action dated Oct. 10, 2015; Appln. No. 201410514944.0.

Extended European Search Report dated Apr. 25, 2018; Appln. No. 15787431.4.

* cited by examiner

TOUCH DISPLAY PANEL AND DISPLAY DEVICE

TECHNICAL FIELD

Embodiments of the present invention relate to a touch display panel and a display device.

BACKGROUND

Touch panels can be roughly classified into touch panels of resistive type, capacitive type, optical type, acoustic wave type, and electromagnetic type based on the sensing modes.

An optical type touch panel usually adopts the mechanism of blocking of light reception, in which light sources and receivers are arranged all over the panel in a matrix, and when light rays are blocked, the positions of the receivers receiving no signals can be recorded and thus the exact position of touch can be determined. Components of an optical type touch panel include a glass substrate, infrared light emitters and infrared light receivers. In a common configuration, infrared light emitters are disposed on the left and lower sides of a glass panel, and infrared receivers are disposed on the right and upper sides of the glass panel. When a finger or other contacting object blocks the infrared light, the position of the contact point in the matrix can be detected through signals received by the receivers.

However, an optical type touch panel generally requires both infrared light emitters and infrared receivers, and therefore has a complex structure and incurs a high cost.

SUMMARY

A purpose of embodiments of the present invention is to provide a touch display panel and a display device so as to solve the problems of structural complexity and high costs of optical type touch panels.

At least one embodiment of the present invention provides a touch display panel, which includes a first substrate and a second substrate disposed opposite to each other; a black matrix; and a plurality of light sensing elements, a plurality of scan lines and a plurality of signal lines formed on the second substrate. The black matrix is formed on the first substrate and only transmits light within a first wavelength range. The light sensing elements are shaded by the black matrix. Each scan line is connected to a first end of a corresponding light sensing element, and each signal line is connected to a second end of the corresponding light sensing element. The light sensing element is configured to generate a touch signal according to the received light within the first wavelength range and the scanning signal provided by the scan line and supply the touch signal to the corresponding signal line.

In the embodiment of the present invention, the black matrix formed on the first substrate can transmit light within the first wavelength range, and the light sensing elements formed on the second substrate become conductive upon receiving light within the first wavelength range and transform the scanning signal into a touch signal, thereby realizing the touch functionality.

For example, the material of the black matrix may be germanium crystal material.

For example, the first wavelength range may be from 2 to 12 μm. In the embodiment of the present invention, the first wavelength range, natural light is blocked by the black matrix and the incident light of wavelengths of human body radiation may be transmitted through the black matrix.

For example, the material of the light sensing elements may be an infrared sensitive material. In the embodiment of the present invention, when a finger is touching the display panel, the infrared sensitive materials of the light sensors become conductive depending on the incident light of wavelengths of human body radiation that has been transmitted through the black matrix.

For example, the scan lines and the signal lines may be shaded by the black matrix. In the embodiment of the present invention, the aperture ratio of pixels will not be influenced by individual scan lines and individual signal lines.

For example, the light sensing elements may be uniformly distributed on the second substrate. In the embodiment of the present invention, the uniformly distributed light sensing elements can increase touch accuracy.

For example, the touch display panel may further include a plurality of thin film transistors (TFTs) formed on the second substrate with the amount of the TFTs being larger than or equal to that of the light sensing elements; each of the light sensing elements is formed over one thin film transistor. In the embodiment of the present invention. In the case where touch requirements are satisfied, touch signals can be generated by means of fewer light sensing elements so as to simplify the structure of the touch display panel and reduce its cost.

For example, the touch display panel may be a liquid crystal display panel or an organic light emitting diode (OLED) display panel.

For example, the touch display panel may further include a liquid crystal layer between the first substrate and the second substrate; the first substrate is a color filter substrate and the second substrate is an array substrate; a plurality of strip-shaped color filters are formed on the first substrate; and the black matrix is formed between adjacent color filters. The embodiment of the present invention provides a touch display panel for a liquid crystal display device.

For example, the touch display panel may further include an organic electroluminescent layer formed on the second substrate; the first substrate is an encapsulating substrate or a color filter substrate, and the second substrate is an array substrate; when the first substrate is a color filter substrate, a plurality of strip-shaped color filters are formed on the first substrate and the black matrix is formed between adjacent color filters. The embodiment of the present invention provides a touch display panel for an OLED display device.

For example, the touch display panel may further include an integrated circuit element on the second substrate; the integrated circuit element is configured to determine the touch position according to the coordinates of the light sensing element that generated the touch signal.

An embodiment of the present invention provides a display device including the touch display panel provided in any of the embodiments above.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

REFERENCE NUMERALS

1—first substrate; 2—second substrate; 3—black matrix; 4—light sensing element; 5—scan line; 6—signal line; 7—thin film transistor (TFT); 8—liquid crystal; 9—color filter; 10—organic electroluminescent layer; 11—spectrum of natural light; 12—spectrum of human body radiation; 13—integrated circuit element.

DETAILED DESCRIPTION

Implementation procedures of embodiments of the present invention will be described in detail below with reference to accompanying drawings. It is to be noted that, the same or similar labels refer throughout to the same or similar elements or the elements of the same or similar functionality. Embodiments to be described below with reference to accompanying drawings are illustrative, i.e. they are only used to explain the present invention and should not be appreciated to be limitative of the present invention.

Embodiment 1

The embodiment of the present invention provides a touch display panel, which includes a first substrate and a second substrate disposed opposite to each other; a black matrix formed on the first substrate; a plurality of light sensing elements, a plurality of scan lines and a plurality of signal lines formed on the second substrate. The black matrix only transmits, i.e., pass along the light within the first wavelength range and shades the light sensing elements. Each scan line is connected to the first end of the corresponding light sensing element, and each signal line is connected to the second end of the corresponding light sensing element. The light sensing element is configured to generate a touch signal according to the received light within the first wavelength range and the scanning signal provided by the scan line and supply the touch signal to the corresponding signal line.

In the embodiment of the present invention, the black matrix formed on the first substrate may transmit the light within the first wavelength range, and the light sensing element generates a touch signal according to the scanning signal and the light within the first wavelength range. For example, the light sensing element becomes conductive when receiving the light within the first wavelength range, and the conductive light sensing element generates a touch signal according to the scanning signal and supplies the touch signal to the signal line. Finally, the touch signal may be processed by an integrated circuit element to obtain the coordinates of the light sensing element that generated the touch signal and thereby to determine the touch position, so that the touch functionality is achieved.

The touch structure of the touch display panel provided in the embodiment of the present invention is implemented by means of a black matrix capable of light filtering, light sensing elements, scan lines and signal lines, so that it can be applicable to liquid crystal display panels and organic light emitting diode (OLED) display panels. The detailed description is as follows.

Figure 1:
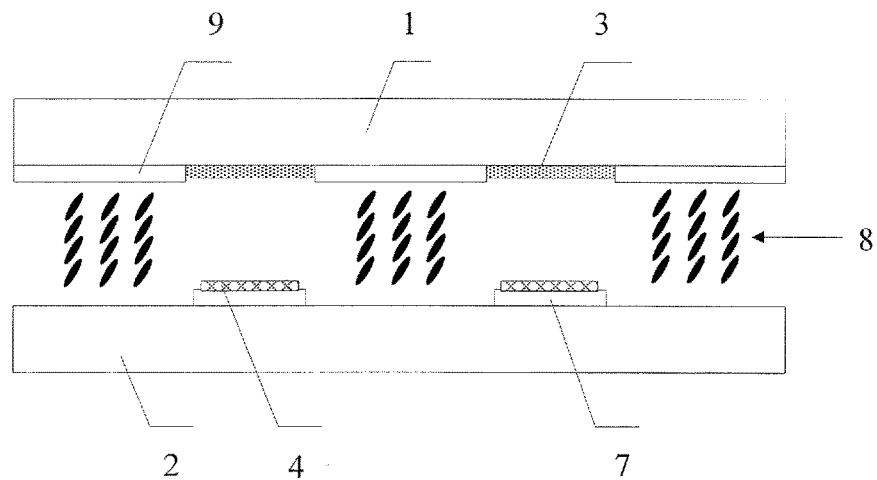
FIG. 1 is a structure diagram of the first touch display panel provided in an embodiment of the present invention.

With reference to FIG. 1, the first touch display panel provided in the embodiment of the present invention includes a first substrate 1 and a second substrate 2 disposed opposite to each other. For example, the first substrate 1 is a color filter substrate, on which a plurality of strip-shaped color filters 9 are formed, while the second substrate 2 is an array substrate.

Figure 2:
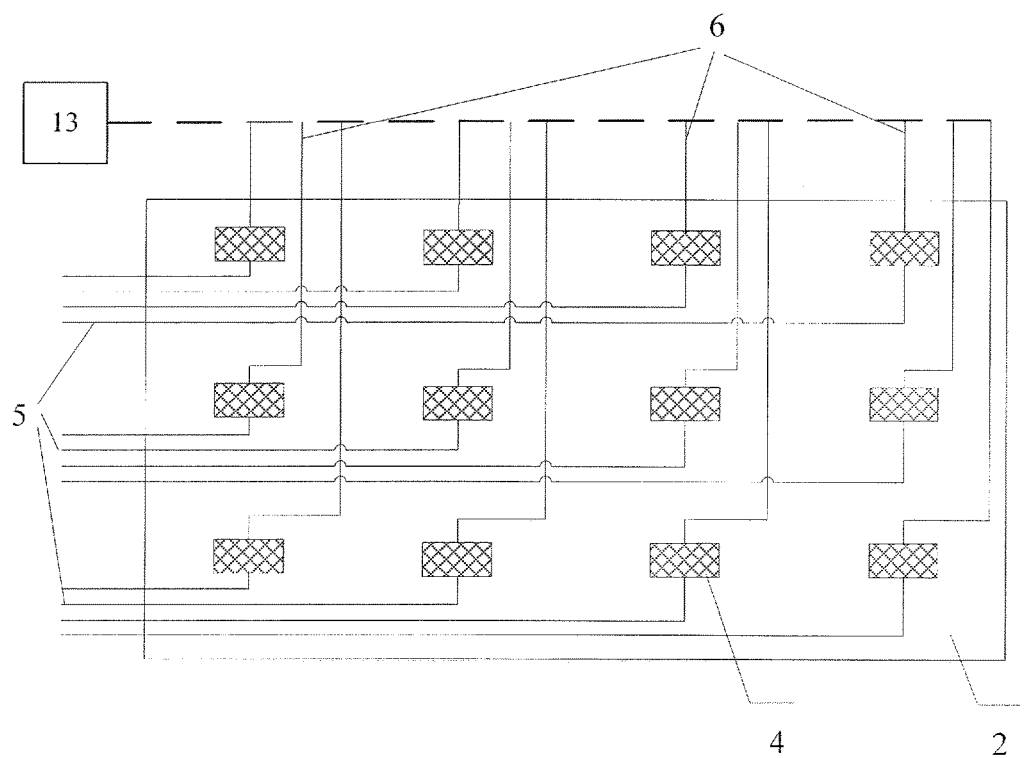
FIG. 2 is a schematic diagram of the connection between scan lines, signal lines and light sensing elements in a touch display panel provided in an embodiment of the present invention.

The touch display panel further includes a black matrix 3, light sensing elements 4, thin film transistors (TFTs) 7 and liquid crystal 8. The black matrix 3 is formed on the first substrate 1 between adjacent color filters 9, and only transmits the light within the first wavelength range, such as the incident light of the wavelengths of human body radiation. As shown in FIG. 2, the touch display panel further includes a plurality of light sensing elements 4, a plurality of scan lines 5 and a plurality of signal lines 6 formed on the second substrate 2; each scan line 5 is connected to the first end of the corresponding light sensing element 4 and, each signal line 6 is connected to the second end of the corresponding light sensing element 4.

The light sensing element 4 generates a touch signal according to the received light within the first wavelength range and the scanning signal provided by the scan line 5 and supplies the touch signal to the corresponding signal line 6. For example, the light sensing element is in a non-conductive sate when receiving no light within the first wavelength range, and becomes conductive when receiving the light within the first wavelength range. Therefore, upon the light within the first wavelength range being received by the light sensing element 4, the scanning signal provided by the scan line 5 is transformed by the conductive light sensing element 4 and has its signal parameters (e.g. voltage and current) changed in accordance with the characteristics of the light sensing element 4, so that the light sensing element 4 generates a touch signal similar to the scanning signal and supplies it to the signal line 6.

In the liquid crystal touch display panel in the embodiment of the present invention, the black matrix 3 formed on the first substrate 1 may transmit the light within the first wavelength range, and the light sensing element generates a touch signal according to the scanning signal and the light within the first wavelength range. For example, the light sensing element 4 can become conductive when receiving the light within the first wavelength range, and the conductive light sensing element 4 generates a touch signal according to the scanning signal and supplies the touch signal to the signal line 6. Finally, the touch signal may be processed by an integrated circuit element to obtain the coordinates of the light sensing element 4 that generated the touch signal and thereby to determine the touch position. For example, the touch signal output from the signal line may be supplied to the integrated circuit element, which has the coordinates of the position of the light sensing element corresponding to each signal line stored therein previously, and can obtain the coordinates of the position of the light sensing element connected with the signal line, so as to obtain the touch position of the light sensing element that generated the touch signal, thereby achieving the touch functionality.

Figure 3:
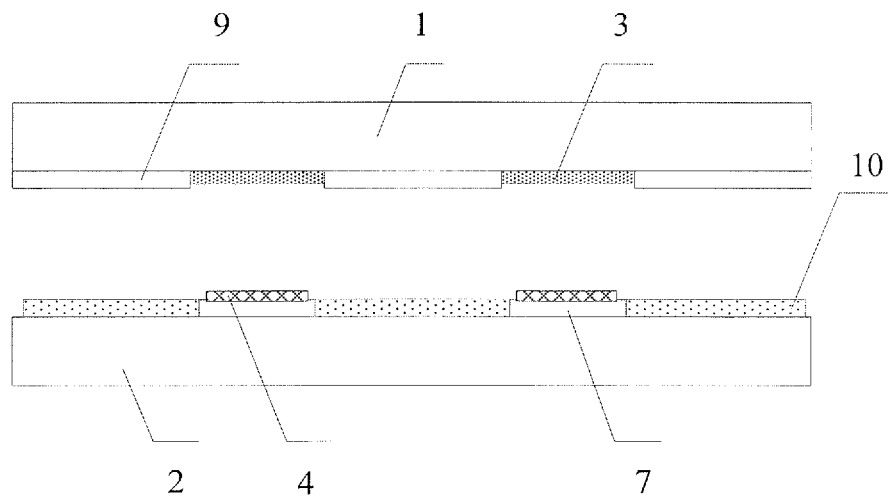
FIG. 3 is a structure diagram of the second touch display panel provided in an embodiment of the present invention.

With reference to FIG. 3, the second touch display panel provided in the embodiment of the present invention includes a first substrate 1 and a second substrate 2 disposed opposite to each other. For example, the first substrate 1 is a color filter substrate, on which a plurality of strip-shaped color filters 9 are formed, while the second substrate 2 is an array substrate.

The touch display panel further includes a black matrix 3, light sensors 4, TFTs 7 and an organic electroluminescent layer 10 with the organic electroluminescent layer 10 being formed on the second substrate 2. The black matrix 3 is formed on the first substrate 1 between adjacent color filters 9, and only transmits the light within the first wavelength range, such as the incident light of the wavelengths of human body radiation. As shown in FIG. 2, the touch display panel further includes a plurality of light sensing elements 4, a plurality of scan lines 5 and a plurality of signal lines 6 formed on the second substrate 2; each scan line 5 is connected to the first end of the corresponding light sensing element 4, and each signal line 6 is connected to the second end of the corresponding light sensing element 4.

The light sensing element 4 generates a touch signal according to the received light within the first wavelength range and the scanning signal provided by the scan line 5 and supplies the touch signal to the corresponding signal line 6. For example, the light sensing element 4 is in a non-conductive sate when receiving no light within the first wavelength range, and becomes conductive when receiving the light within the first wavelength range. Therefore, upon the light within the first wavelength range being received by the light sensing element 4, the scanning signal provided by the scan line 5 is transformed by the conducting light sensing element 4 and has its signal parameters (e.g. voltage and current) changed in accordance with the characteristics of the light sensing element 4, so that the light sensing element 4 generates a touch signal similar to the scanning signal and supplies it to the signal line 6.

In the OLED touch display panel in an embodiment of the present invention, the black matrix 3 formed on the first substrate 1 may transmit the light within the first wavelength range; the light sensing element 4 generates a touch signal according to the scanning signal and the light within the first wavelength range, for example, the light sensing element 4 becomes conductive upon receiving the light within the first wavelength range, and the conductive light sensing element 4 generates a touch signal according to the scanning signal and supplies the touch signal to the signal line 6. Finally, the touch signal may be processed by an integrated circuit element to obtain the coordinates of the light sensor 4 that generated the touch signal and thereby to determine the touch position, so that the touch functionality is achieved.

When the light source in the OLED display panel is red, green, and blue monochromic OLED in corresponding pixels, no color filters are needed to filter the light irradiated from individual pixels, so that a modified version of the touch display panel shown in FIG. 3 can be obtained as follows: the color filters 9 on the first substrate 1 in FIG. 3 are removed, i.e., the first substrate 1 is an encapsulating substrate. Other configurations of the display panel is the same as those of the touch display panel shown in FIG. 3, which will not be further detailed here.

Figure 4:
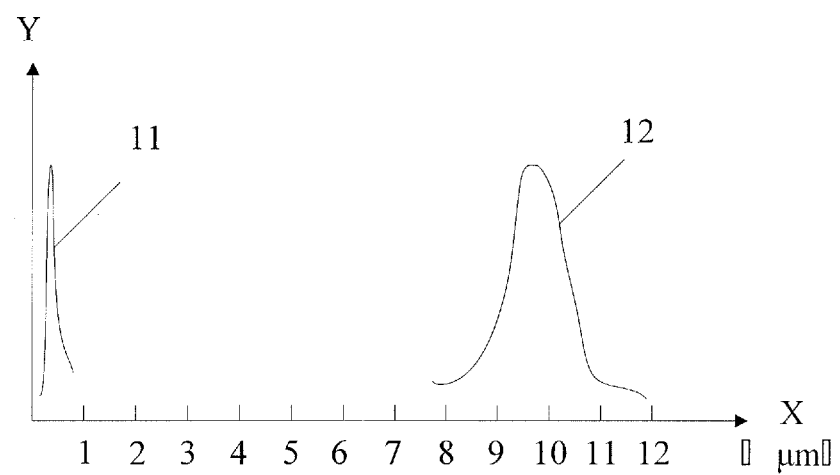
FIG. 4 is a schematic diagram of the incidence spectrum in an embodiment of the present invention.
Figure 5:
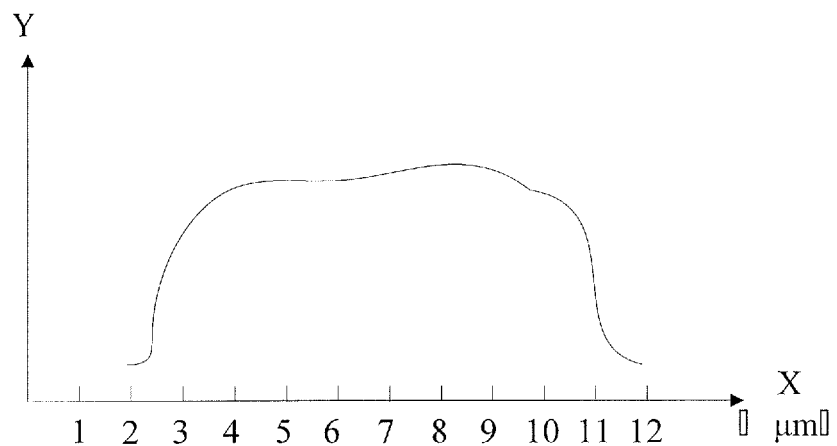
FIG. 5 is a schematic diagram of the transmission spectrum of the black matrix of germanium crystal in an embodiment of the present invention.

In the touch display panels provided in the foregoing, for example, the black matrix 3 is made of germanium crystal material and the first wavelength range may be in the range of 2-12 μm. In the embodiment of the present invention, in the first wavelength range, natural light is blocked by the black matrix 3, while the incident light of the wavelengths of human body radiation can be transmitted through the black matrix 3. FIG. 4 shows the comparison in spectrum between natural light and the incident light of the wavelengths of human body radiation, where X axis represents wavelength and Y axis represents intensity (specific values of the light intensity are dependent on practical situations). The wavelength range of natural light spectrum 11 is in the range of 0.3-0.7 μm, while the wavelength range of the human body radiation spectrum 12 is in the range of 9-11 μm. FIG. 5 is a schematic diagram showing the transmittance of the black matrix 3 of germanium crystal material, where X axis represents wavelength and Y axis represents the transmittance of the black matrix (specific values of the transmittance are dependent on specific components of the materials of the black matrix). The black matrix 3 is capable of transmitting light within the first wavelength range. Since the first wavelength range is in the range of 2-12 μm and the wavelength range of human body radiation is in the range of 9-11 μm, the black matrix 3 can block natural light and transmit the light of human body irradiation. As a result, the light sensing elements 4 are enabled to receive the light of human body irradiation when a finger is touching the display panel.

Figure 6:
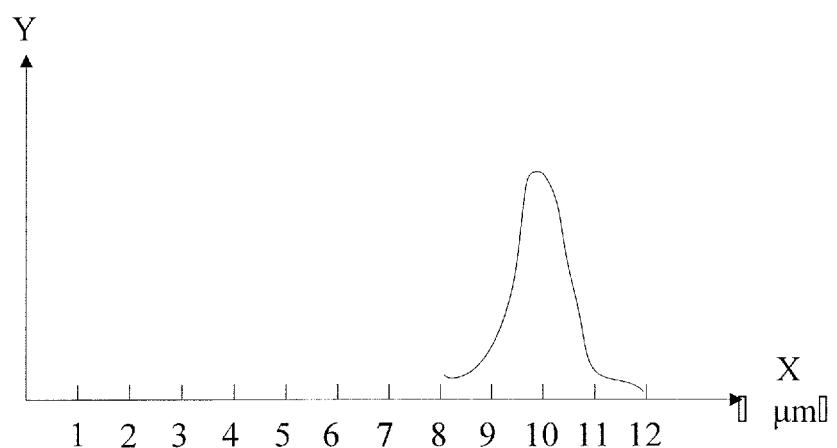
FIG. 6 is a schematic diagram of the reception spectrum of the infrared light sensing elements in an embodiment of the present invention.

For example, the light sensing elements 4 can be made of an infrared sensitive material. FIG. 6 is a schematic diagram showing the reception spectrum of the infrared sensitive material, where X axis represents wavelength and Y axis represents light intensity (specific values of the light intensity are dependent on practical situations). When the wavelength of the incident light are within the range of 9-11 μm, the infrared light sensitive material can become electrically conductive. Therefore, when a finger is touching the display panel, the infrared sensitive material of the light sensing elements 4 become conductive depending on the incident light of wavelengths of human body radiation that has been transmitted through the black matrix 3.

The light intensity or transmittance represented by the Y axes in FIGS. 4-6 are only for the purpose of illustrating embodiments of the present invention, and not limited to any specific value range; considerable variations in value may exist for different intensities of the incident light or different black matrixes, whereas all the variations in value can be utilized depending on the modified versions of the touch display panel provided in the embodiment of the present invention, which will not be further detailed here.

For example, individual scan lines 5 and individual signal lines 6 are shaded by the black matrix 3. In the embodiment of the present invention, the aperture ratio of pixels will not be influenced by the scan lines 5 and the signal lines 6.

For example, the light sensing elements 4 are distributed uniformly on the second substrate 2. In the embodiment of the present invention, the uniformly distributed light sensing elements 4 can increase touch accuracy.

For example, the amount of the TFTs 7 may be larger than that of the light sensing elements 4 with each light sensing element 4 is formed over one TFT 7. In the embodiment of the present invention, in the case where touch requirements are satisfied, touch signals can be generated by means of fewer light sensing elements 4 so as to simplify the structure of the touch display panel and reduce its cost.

Of course, the touch display panel may further include an integrated circuit element 13, which is formed on the second substrate 2 and determines the touch position in accordance with the coordinates of the light sensing element 4 that generated the touch signal, which will not be further detailed here.

In the touch display panel provided in an embodiment of the present invention, the amount of the light sensing elements 4 is dependent on practical situations. If high touch accuracy is required, each TFT 7 may be provided with a light sensing element 4 over it, provided that the aperture ratio of pixels will not be influenced by the scan lines 5 and signal lines 6 on the second substrate 2. If low touch accuracy is required, some, not all of the TFTs 7 may each have light sensing elements 4 disposed over them. For example, the touch display panel can be used for display of program icons to be selected. In this application scenario, since the required touch accuracy is relatively low and each icon corresponds to a plurality of pixels (i.e., to a plurality of TFTs), the touch requirement will be satisfied as long as a few light sensing elements are distributed uniformly within the boundary of the icon.

In the embodiment of the present invention, the black matrix 3 formed on the first substrate 1 can transmit light within the first wavelength range, and the light sensing elements 4 formed on the second substrate 2 are capable of conducting upon receiving the light within the first wavelength range, so that the touch functionality can be achieved upon the touch display panel being touched by an object with wavelengths within the first wavelength range, thereby providing a touch display with a simple structure and a relatively low cost.

Embodiment 2

The embodiment of the present invention provides a display device, which is a liquid crystal display device and includes the touch display panel provided in embodiment 1 as shown in FIG. 1.

In the embodiment of the present invention, the black matrix formed on the first substrate can transmit the light within the first wavelength range, the light sensing elements formed on the second substrate is conductive when receiving light within the first wavelength range, so that touch functionality can be achieved upon the touch display panel being touched by an object with wavelengths within the first wavelength range, thereby providing a touch display with a simple structure and a relatively low cost.

Embodiment 3

The embodiment of the present invention provides a display device, which is an OLED display device and includes the touch display panel provided in embodiment 1 as shown in FIG. 3 or a modified version thereof.

In the embodiment of the present invention, the black matrix 3 formed on the first substrate 1 can transmit the light within the first wavelength range, and the light sensing elements 4 formed on the second substrate 2 are conductive upon receiving the light within the first wavelength range, so that the touch functionality can be achieved upon the touch display panel being touched by an object with wavelengths within the first wavelength range, thereby providing a touch display with a simple structure and a relatively low cost.

What are described above is related to the illustrative embodiments of the present invention only and not limitative to the scope of the present invention; the scopes of the present invention are defined by the accompanying claims.

The present application claims priority of China patent application No. 201410514944.0 filed on Sep. 29, 2014, which is incorporated herein by reference in its entirety as a part of the present application.

The invention claimed is:

1. A touch display panel, comprising:
   a first substrate and a second substrate disposed opposite to each other;
   a black matrix formed on the first substrate and only transmitting light within a first wavelength range, wherein the black matrix is configured to transmit light of human body irradiation which is in a range of 9-11 μm;
   a plurality of thin film transistors formed on the second substrate; and
   a plurality of light sensing elements, a plurality of scan lines and a plurality of signal lines formed on the second substrate,
   wherein the light sensing elements are shaded by the black matrix; each of the scan lines is connected to a first end of a corresponding one of the light sensing elements, and each of the signal lines is connected to a second end of the corresponding one of the light sensing elements;
   the plurality of thin film transistors are arranged along a first direction, and an orthographic projection of each of the light sensing elements on the second substrate are completely within an orthographic projection of one of the thin film transistors on the second substrate in the first direction; and
   the light sensing element is configured to generate a touch signal according to the received light within the first wavelength range and the scanning signal provided by the scan line and supply the touch signal to the corresponding signal line.

2. The touch display panel according to claim 1, wherein a material of the black matrix is germanium crystal material.

3. The touch display panel according to claim 1, wherein the first wavelength range is 2-12 μm.

4. The touch display panel according to claim 1, wherein a material of the light sensing elements is an infrared sensitive material.

5. The touch display panel according to claim 1, wherein scan lines and signal lines are shaded by the black matrix.

6. The touch display panel according to claim 1, wherein the light sensing elements are uniformly distributed on the second substrate.

7. The touch display panel according to claim 1, wherein a number of the thin film transistors is larger than or equal to that of the light sensing elements, and each of the light sensing elements is formed at a side of the thin film transistors away from the second substrate.

8. The touch display panel according to claim 1, wherein the touch display panel is a liquid crystal display panel or an organic light emitting diode display panel.

9. The touch display panel according to claim 1, further comprising a liquid crystal layer disposed between the first substrate and the second substrate,
   wherein the first substrate is a color filter substrate, on which a plurality of strip-shaped color filters are formed; the black matrix is formed between adjacent color filters; and the second substrate is an array substrate.

10. The touch display panel according to claim 1, further comprising an organic electroluminescent layer formed on the second substrate,
    wherein the first substrate is an encapsulating substrate or a color filter substrate and the second substrate is an array substrate, and
    where the first substrate is a color filter substrate, a plurality of strip-shaped color filters are further formed on the first substrate and the black matrix is formed between adjacent color filters.

11. The touch display panel according to claim 1, further comprising an integrated circuit element on the second substrate, wherein the integrated circuit element is configured to determine the touch position according to coordinates of the light sensing element that generated the touch signal.

12. A display device comprising the touch display panel according to claim 1.

13. The touch display panel according to claim 5, wherein the light sensing elements are uniformly distributed on the second substrate.

14. The touch display panel according to claim 5, wherein the touch display panel further comprises a plurality of thin film transistors formed on the second substrate with a mount of the thin film transistors being larger than or equal to that of the light sensing elements, and each of the light sensing elements is formed over one of the thin film transistors.

15. The touch display panel according to claim 5, wherein the touch display panel is a liquid crystal display panel or an organic light emitting diode display panel.

16. The touch display panel according to claim 5, further comprising a liquid crystal layer disposed between the first substrate and the second substrate,
wherein the first substrate is a color filter substrate, on which a plurality of strip-shaped color filters are formed; the black matrix is formed between adjacent color filters;
and the second substrate is an array substrate.

17. The touch display panel according to claim 5, further comprising an organic electroluminescent layer formed on the second substrate,
wherein the first substrate is an encapsulating substrate or a color filter substrate and the second substrate is an array substrate, and
where the first substrate is a color filter substrate, a plurality of strip-shaped color filters are further formed on the first substrate and the black matrix is formed between adjacent color filters.

18. A touch display panel, comprising:
a first substrate and a second substrate disposed opposite to each other;
a black matrix formed on the first substrate and only transmitting light within a first wavelength range, wherein the black matrix is configured to transmit light of human body irradiation which is in a range of 9-11 µm; and
a plurality of light sensing elements, a plurality of scan lines and a plurality of signal lines formed on the second substrate,
wherein the light sensing elements are shaded by the black matrix; each of the scan lines is connected to a first end of a corresponding one of the light sensing elements, and each of the signal lines is connected to a second end of the corresponding one of the light sensing elements; and
the light sensing element is configured to generate a touch signal according to the received light within the first wavelength range and the scanning signal provided by the scan line and supply the touch signal to the corresponding signal line.

19. The touch display panel according to claim 18, wherein the black matrix is made of germanium crystal.

20. A touch display panel, comprising:
a first substrate and a second substrate disposed opposite to each other;
a black matrix formed directly on the first substrate intermittent with stripe shaped color filters without contacting a display layer and wherein the black matrix only transmits light within a first wavelength range between 9-11 µm of a human touch and blocks a second wavelength range of a natural light; and
a plurality of light sensing elements uniformly distributed over the first substrate, a plurality of scan lines and a plurality of signal lines formed on the second substrate, wherein the black matrix shades exclusively all the light sensing elements and not switching elements; each of the scan lines is connected to a first end of a corresponding one of the light sensing elements, and each of the signal lines is connected to a second end of the corresponding one of the light sensing elements; and the light sensing element is configured to generate a touch signal according to the received light within the first wavelength range and the scanning signal provided by the scan line and supply the touch signal to the corresponding signal line.

* * * * *